United States Patent [19]
Hisazumi et al.

[11] Patent Number: 6,017,246
[45] Date of Patent: Jan. 25, 2000

[54] PRINTED WIRING BOARD

[75] Inventors: Takao Hisazumi, Ibaraki; Hiroshi Iwamoto; Kaoru Shimizu, both of Osaka, all of Japan

[73] Assignee: Matsushita Electric Industrial Co., Ltd., Osaka, Japan

[21] Appl. No.: 08/869,856

[22] Filed: Jun. 5, 1997

[30] Foreign Application Priority Data

Jun. 10, 1996 [JP] Japan ..................... 8-146969

[51] Int. Cl.⁷ .................................... H01R 9/09
[52] U.S. Cl. ................. 439/637; 439/84; 439/377
[58] Field of Search ............... 439/377, 64, 637, 439/60, 634, 635, 636, 84

[56] References Cited

U.S. PATENT DOCUMENTS

| | | | |
|---|---|---|---|
| 2,711,523 | 6/1955 | Willis | 439/635 |
| 2,879,491 | 3/1959 | Shapiro | 439/62 |
| 3,155,767 | 11/1964 | Schellack | 439/83 |
| 3,671,917 | 6/1972 | Ammon et al. | 439/62 |
| 3,740,699 | 6/1973 | Johnson et al. | 439/637 |
| 3,932,016 | 1/1976 | Ammenheuser | 439/377 |
| 4,349,237 | 9/1982 | Cobaugh et al. | 439/328 |
| 4,575,167 | 3/1986 | Minter | 439/83 |
| 4,677,527 | 6/1987 | Pasterchick, Jr. et al. | 439/327 |
| 5,055,061 | 10/1991 | Lichtenwalter | 439/377 |
| 5,203,725 | 4/1993 | Brunker | 439/636 |

FOREIGN PATENT DOCUMENTS

| | | |
|---|---|---|
| 5-217628 | 8/1993 | Japan . |
| 6-20917 | 1/1994 | Japan . |
| 6-58564 | 8/1994 | Japan . |

OTHER PUBLICATIONS

IBM Technical Disclosure, Schmieg, vol. 10, No. 11, p. 1695, Apr. 1968.

*Primary Examiner*—Neil Abrams
*Attorney, Agent, or Firm*—Ratner & Prestia

[57] ABSTRACT

A printed wiring board comprises a main board and a pair of rows of connection terminals for holding a card board in a vertical position. Each connection terminal is inserted into the main board at a predetermined interval, and electrically connected with a circuit pattern of the main board. The printed wiring board allows the card board to be positioned vertically on the main board, and is adaptable to change the number of patterned external connection terminals of the card board. A guide means with resilient tongues may be provided at the respective ends of the rows to additionally secure the card board in place.

32 Claims, 13 Drawing Sheets

PRINTED WIRING BOARD

BACKGROUND OF THE INVENTION

The present invention relates to a printed wiring board having an electric circuit, especially a printed wiring board with a card board (subsidiary printed wiring board, daughter board) provided vertically on a main board (main printed wiring board, mother board) so that they are electrically connected with each other.

Conventionally, as means for providing a card board vertically on a main board so that they are electrically connected with each other, as proposed in Japanese Utility Patent Laid-Open Publication No. 6-58564, lead pins have been fixed to an end of a card board in two rows with a predetermined spacing between them, inserted to through holes of a main board, and soldered therein.

Figure 19A:
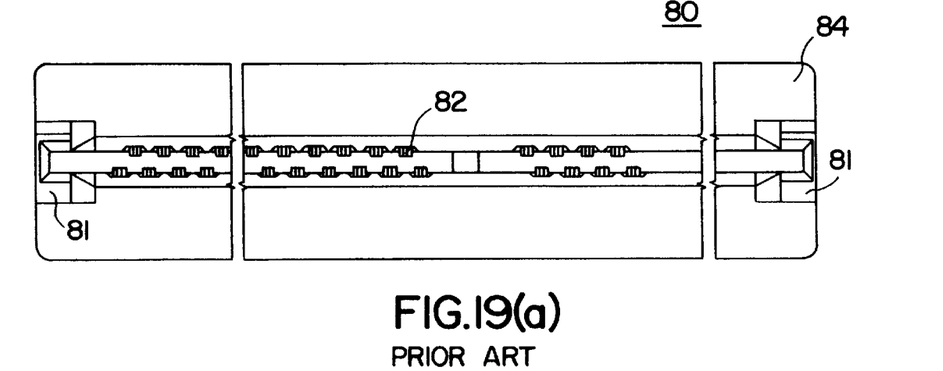
FIG. 19(a) is a plan view of a conventional card edge connector.
Figure 19B:
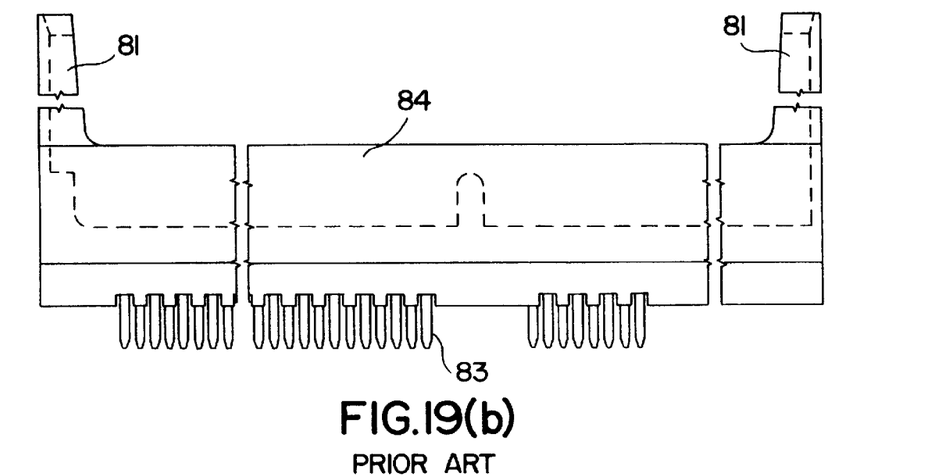
FIG. 19(b) is a front view of the connector.
Figure 19C:
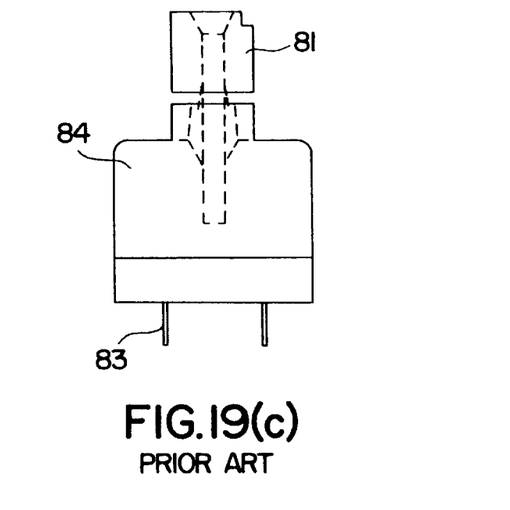
FIG. 19(c) is a side view thereof.

Further, as shown in FIGS. 19(*a*), 19(*b*) and 19(*c*), it has been a general practice to attach a card edge connector to a main board, and insert a card board to the card edge connector for vertical provision thereof. In other words, by inserting the card board to a board guide portion 81, a circuit pattern portion of the card board is brought into contact with connection terminals 83 and the card board is electrically connected with a main board. The card edge connector 80 is provided by inserting connection terminals to a resin case.

It has been a problem, however, that such conventional card edge connector is costly, and a connector case must be newly manufactured whenever the number of patterned external connection terminals (pins) in a card board is changed.

Even the case described in above Japanese Utility Patent Laid-Open Publication must have been carefully handled in order to prevent lead pins attached to a card board to be bent during an assembly process. Additionally, in automatic insertion to a main board, because it is difficult to align the lead pins in position with through holes in the main board, a failure of insertion has been often caused.

SUMMARY OF THE INVENTION

It is hence an object of the invention to solve the problems experienced in the prior art, and provide, at a low cost, a printed wiring board flexib)ly adaptable to change in the number of patterned external connection terminals (pins), and allowing rough positioning alignment between a main board and a card board when the card board is attached to the main board.

In order to achieve the object, a printed wiring board according to the invention is constituted as described below.

In a first aspect thereof, a printed wiring board comprises a main board including a circuit pattern, and a pair of rows of connection terminals for vertically holding a card board, confronting from each other, each connection terminal inserted to the main board at a predetermined interval as being planted on the main board, and electrically connected with the circuit pattern.

In a second aspect thereof, a printed wiring board comprises a main board including a circuit pattern, a pair of rows of connection terminals for vertically holding a card board, confronting from each other, each connection terminal inserted to the main board at a predetermined interval as being planted on the main board, and electrically connected with the circuit pattern, and a pair of guides for preventing inclination of the card board, each guide provided at each of both ends of the pair of rows.

In a third aspect thereof, a printed wiring board comprises a main board including a circuit pattern, a pair of rows of connection terminals for vertically holding a card board, confronting from each other, each connection terminal inserted to the main board at a predetermined interval as being planted on the main board, and electrically connected with the circuit pattern, and a pair of guides, each guide including a clamping portion for clamping the card board and provided at each of both ends of the pair of rows In a fourth aspect thereof, a printed wiring board comprises a main board including a circuit pattern, a pair of rows of connection terminals for vertically holding a card board, confronting from each other, each connection terminal inserted to the main board at a predetermined interval as being planted on the main board, and electrically connected with the circuit pattern, and a guide including an elastic tongue element for clamping the card board, wherein the guide is formed in a U-shape at an end surface in the inserting direction of the card board.

In a fifth aspect thereof, a printed wiring board comprises a main board including a circuit pattern, a pair of rows of connection terminals for vertically holding a card board, confronting from each other, each connection terminal inserted to the main board at a predetermined interval as being planted on the main board, and electrically connected with the circuit pattern, and a guide providing an elastic tongue element, for clamping the card board at the center of the main surface of the guide, wherein the guide is formed in a hook-shape in a side surface of the guide.

In a sixth aspect thereof, a printed wiring board comprises a main board including a circuit pattern, a pair of rows of connection terminals for vertically holding a card board, confronting from each other, each connection terminal inserted to the main board at a predetermined interval as being planted on the main board, and electrically connected with the circuit pattern, and a frame surrounding the pair of rows.

In the constitution described above, a printed wiring board of the invention requires no resin case composing a connector, hence the cost is low, and it is flexible to changes in the number of pins. Further, insertion of a card board is facilitated, and accurate positioning alignment between a card board and a main board is not required. Specifically, by forming a side of connection terminals in contact with a card board in a C-shape, electrical contact between the connection terminals and card board can be more reliably achieved.

By electrical contact between a circuit pattern in a card board and a guide for guiding the card board, the card board can be more efficiently grounded to a main board, and unwanted radiation is also reduced.

By producing a guide for guiding a card board using a metallic material, and bringing the guide in electrical contact with a grounded circuit pattern of the card board, grounding can be facilitated, and no additional wiring and connection terminal of prior art is required. In the case the guide is a resin member, the guide can be mass-produced by injection molding, and the production cost can be reduced.

BRIEF DESCRIPTION OF THE DRAWINGS

FIG. 4 (*a*) is a front view of a portion provided with connection terminals in FIG. 1, and FIG. 4 (*b*) is a representation of the connection terminals with a card board inserted thereto.

PREFERRED EMBODIMENTS OF THE INVENTION

Embodiments of a printed wiring board according to the invention are now described by referring to FIGS. 1 to 18 below.

(Embodiment 1)

A printed wiring board according to embodiment 1 of the invention is described by referring to FIGS. 1 to 16.

In FIGS. 1 to 4, a connection terminal 1, a contact portion 1a of the terminal 1, a back portion 2a of the terminal 1, legs 3 of the terminal 1, a card board guide 4, a guide portion 4a, legs 5 of the guide 4, a card board (subsidiary printed wiring board, daughter board) 10, a main board (main printed wiring board, mother board) 11 and a circuit pattern end 12 arc shown, respectively.

The main board 11 includes a pair of rows of connection terminals 1 which confront from each other. The connection terminals 1 are inserted to a main plane of main board 11 at a predetermined interval as being planted on the main board 11. However, the connection terminals 1 can be provided in a matrix arrangement along lines and rows, forming an arbitrary number of rows. In an example shown in FIGS. 1 and 2, the rows of connection terminals 1 are offset from each other by a half pitch. The connection terminals 1 in the rows serve for vertically holding the card board 10, and electrically contact a predetermined circuit pattern 12 provided in the main board 11. The main board 11 is provided at either end of the connection terminal rows with card board guides 4 symmetrically arranged for preventing inclination of the card board 10.

Figure 4A:
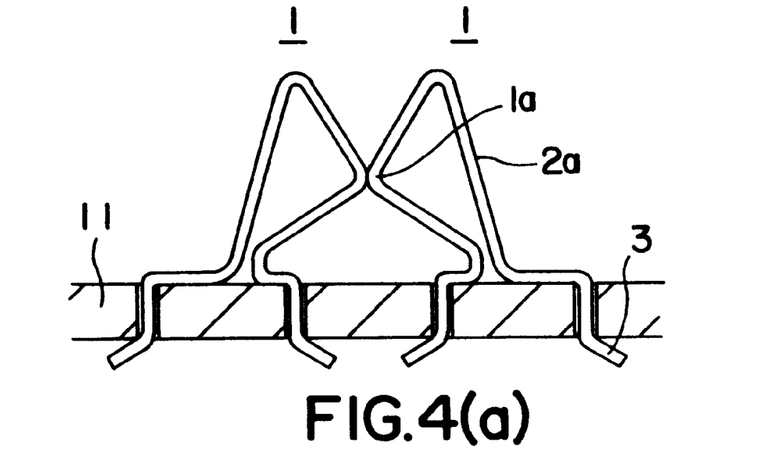

As shown in FIG. 4(a), the connection terminal 1 is formed with the contact portion 1a by forming a side in contact with the circuit pattern 12 in the main plane of card board 10 in a C-shape, and provided with a back portion 2a and two legs 3 at either end. The legs 3 are inserted through through holes in the main board 11, and fixed by bending in the back side of the main board 11. The bent portions may be further soldered. Of course, the legs 3 may be soldered without being bent, after the legs 3 are inserted through the through holes. Similarly, instead of arranging two rows of connection terminals 1 in opposition by offsetting them from each other, they may be also arranged symmetrically in opposition to each other.

The card board guide 4 is fabricated, for example, by press working of a galvanized steel plate, or molding a resin. Then, it serves for guiding (positionally defining) insertion of the card board 10. In order to achieve the object, it is formed in a U-shape in section. For attachment of the guide 4 to main board 11, three legs 5 provided at an end are inserted to through holes, and can be fixed by bending or soldering them similarly to the connection terminals 1.

Figure 1:
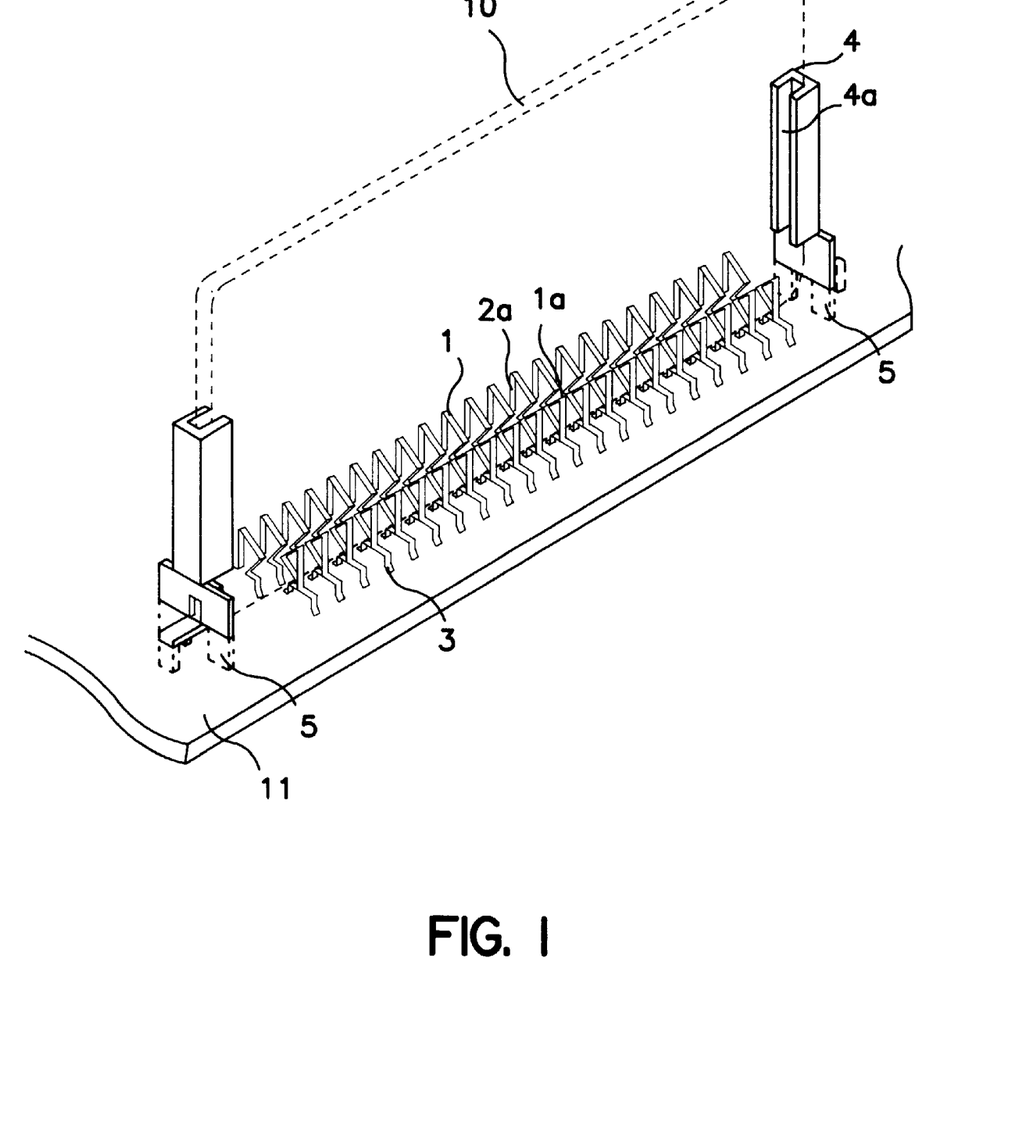
FIG. 1 is a perspective view showing a main part of a printed wiring board according to embodiment 1 of the invention.
Figure 2:
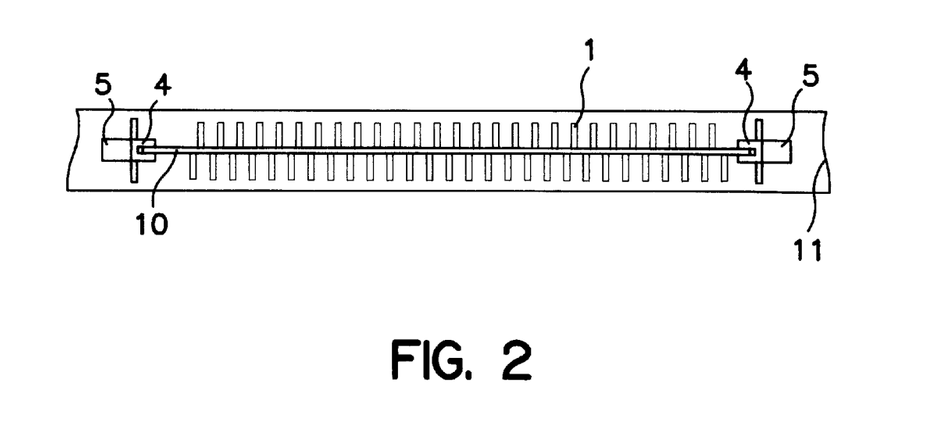
FIG. 2 is a plan view of the board.
Figure 3:
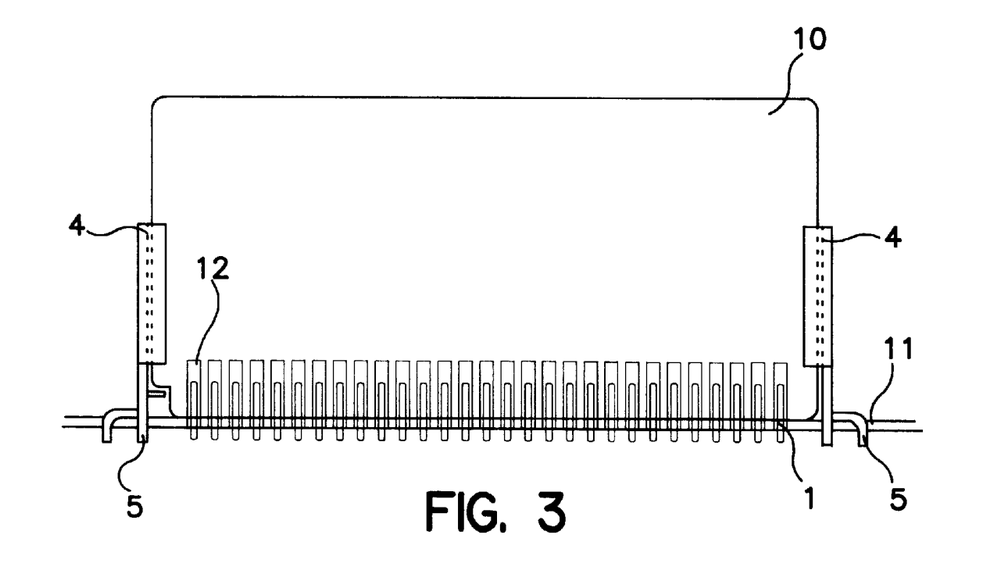
FIG. 3 is a front view thereof.
Figure 4B:
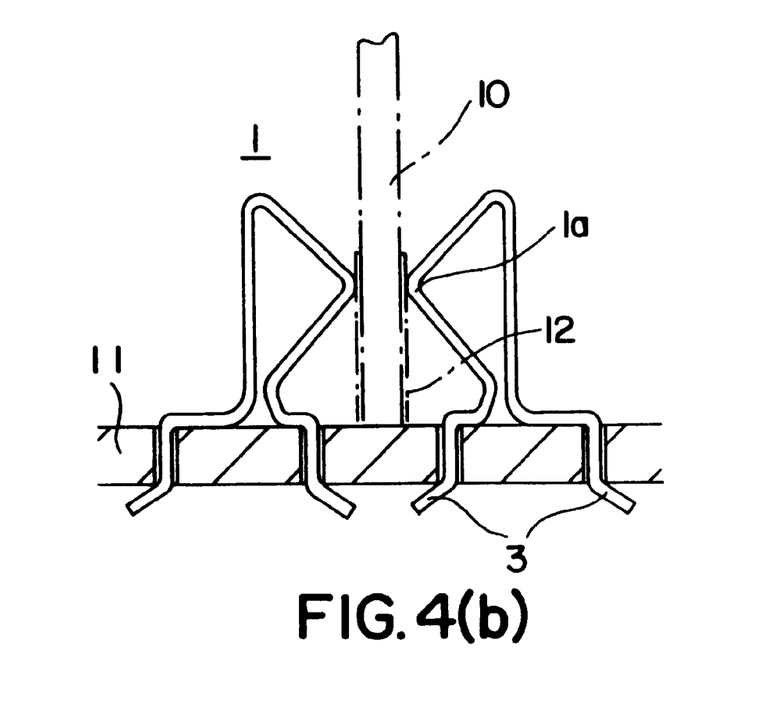

In FIG. 1, the card board 10 is inserted as it is guided by the guide portion 4a of the card board guide 4, and comes into contact with the connection terminals 1. The card board 10 is further pressed toward the main board 11 until it contacts the main board 11. By such inserting operation of the card board 10, the connection terminals 1 shown in FIG. 4 (a) are spread in the direction perpendicular to the main plane of the card board 10, as shown in FIG. 4 (b), and the contact portion 1a of connection terminal 1 is brought into contact with the circuit pattern 12.

In FIGS. 5 to 12, three types of connection terminals 51, 61 and 71 planted in a printed wiring board of the invention are shown. In these cases, the connection terminals are formed, for example, by press working of such metal plate as phosphor bronze plate, and provided in a surface with gold or nickel plating. The connection terminals 51, 61 and 71 are formed with a contact portion and a back portion by bending generally a half of a rectangular plate, and provided with two logs.

Figure 5A:
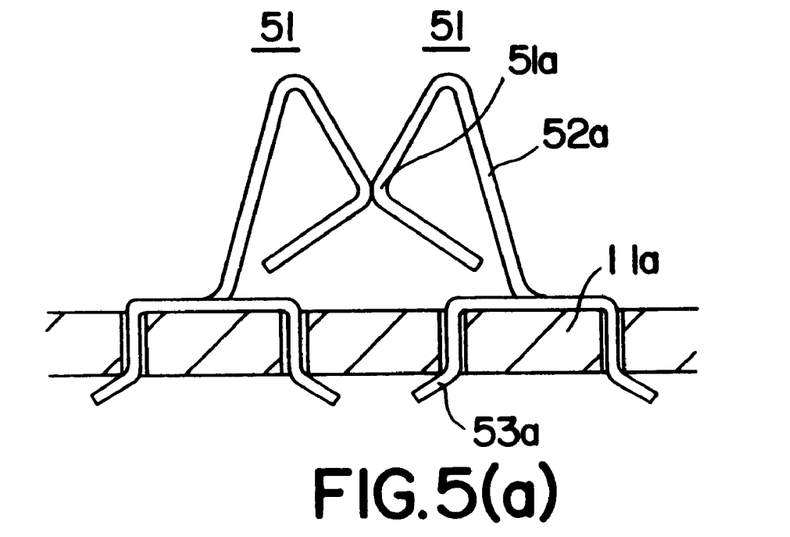
FIG. 5(a) is a front view of a portion provided with connection terminals different from those of FIG. 4(a) according to embodiment 1 of the invention.
Figure 5B:
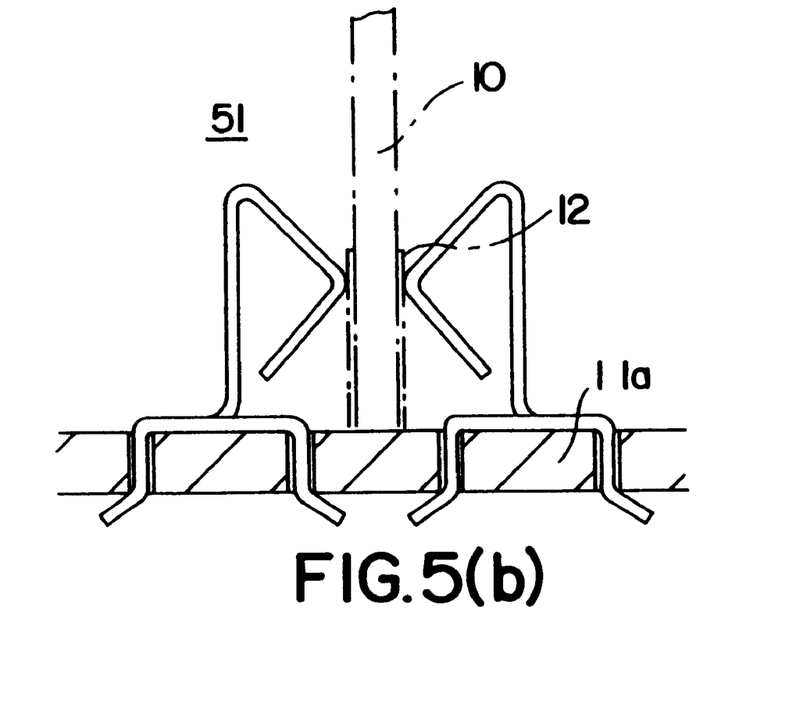
FIG. 5(b) is a representation showing the connection terminals with a card board inserted thereto.
Figures 8A, 8B:
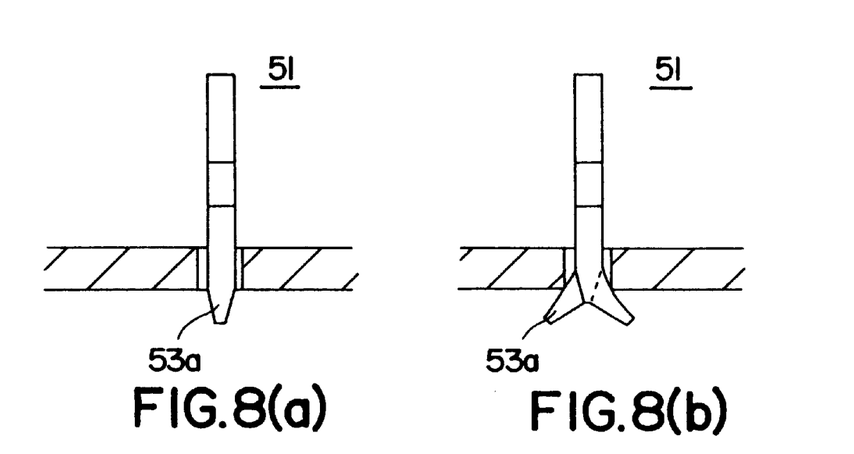
FIG. 8(a) is a sectional view of the connection terminals inserted to a printed wiring board.
FIG. 8(b) is a sectional view of the connection terminals with legs bent in different directions.

The connection terminal 51 having a contact portion 51a, a back portion 52a and a pair of legs 53a is attached to the main board lha by first inserting a pair of legs 53a to through holes in the main board 11a, as shown in FIG. 8(a), then bending the legs 53a in the oblique directions different from each other, as shown in FIG. 8(b). The card board 10 is inserted between confronting contact portions 51a, as shown in FIGS. 5(a) and 5(b).

Figure 9:
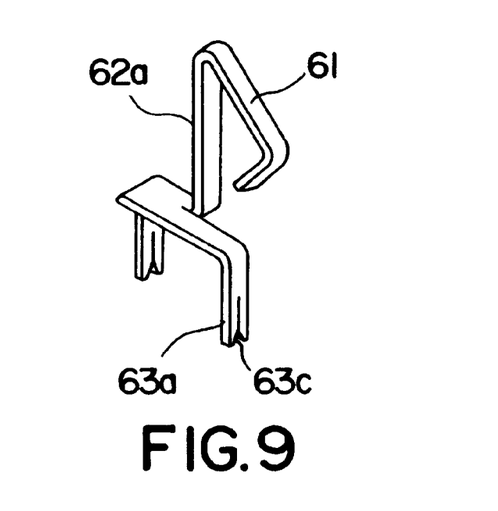
FIG. 9 is an outside perspective view showing the other connection terminals according to embodiment 1 of the invention.
Figure 10A:
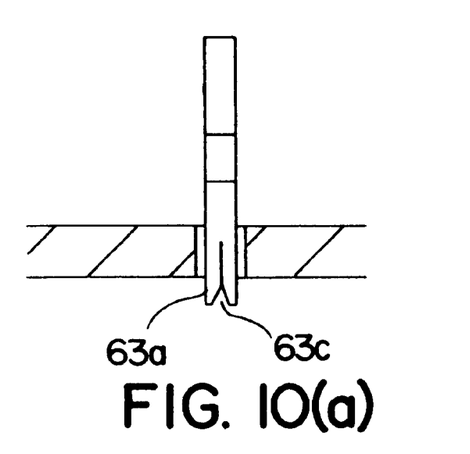
FIG. 10(a) is a sectional view of the connection terminals inserted to a printed wiring board.
Figure 10B:
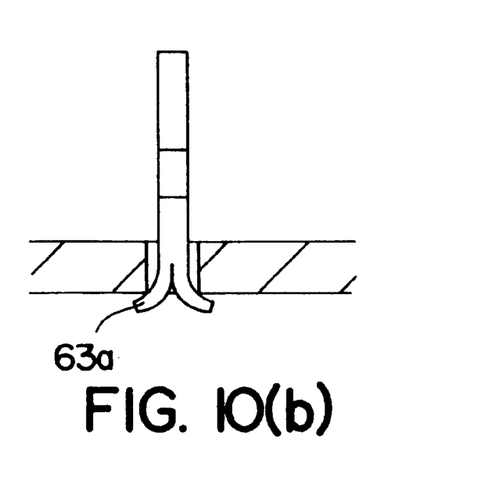
FIG. 10(b) is a sectional view or the connection terminals with legs bent.

The other connection terminal 61 shown in FIG. 9 is provided with a notch 63c that divides a leading end portion of legs 63a. As shown in FIGS. 10(a) and 10(b), the connection terminal 61 is fixed to the main board by bending the divided parts of legs 63a in different directions after inserting the legs 63a to through holes.

Figure 11:
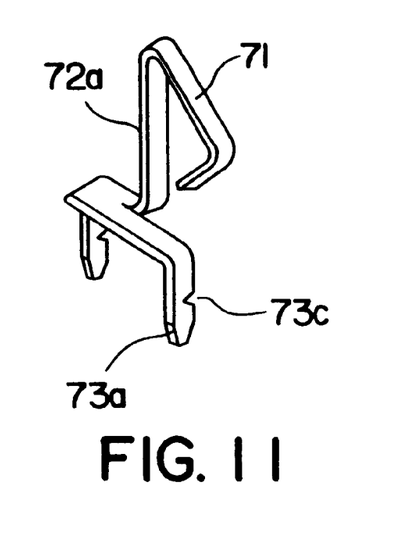
FIG. 11 is an outside perspective view of still other connection terminals according to embodiment 1 of the invention.
Figure 12A:
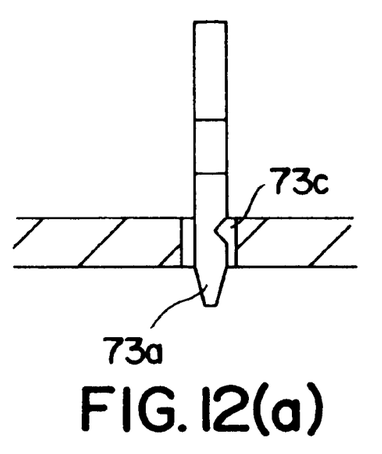
FIG. 12(a) is a sectional view of the connection terminals inserted to a printed wiring board.
Figure 12B:
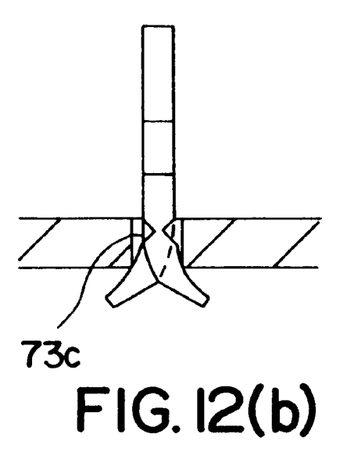
FIG. 12(b) is a sectional view or the connection terminals with legs bent in different directions.

Still other connection terminal 71 shown in FIG. 11 is provided with a notch 73c in the middle of legs 73a. Because of such constitution, the legs 73a can be easily bent by using less force. As shown in FIGS. 12(a) and 12(b), the connection terminal 71 is fixed after insertion to the main board as the legs 73a are bent in different directions.

Figure 6:
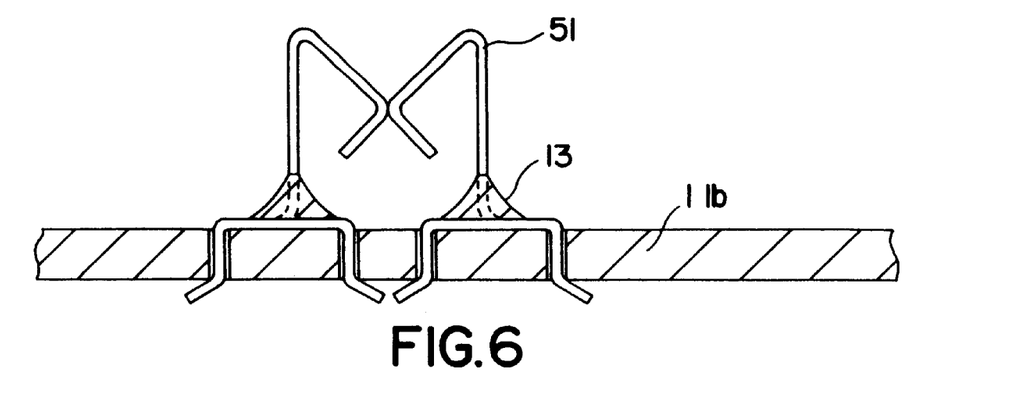
FIG. 6 is a representation showing the connection terminals with an adhesive applied to a base part thereof.
Figure 7:
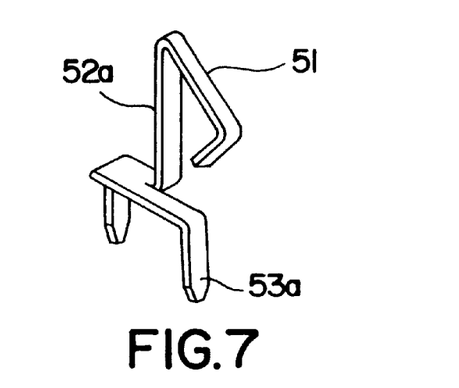
FIG. 7 is an outside perspective view of the connection terminals.

FIG. 6 shows a constitution that such arbitrary adhesive 13 (or resin member) as acrylic resin, epoxy resin and butyl rubber is applied to a base part of the connection terminal 51 planted to the main plane of the main board 11b, after the connection terminal 51 is attached to the main board 11b. By applying and setting either an adhesive or resin member, unsteadiness of connection terminal 51 as well as entrapping of dusts and foreign matters between the main board 11b and the connection terminal 51 can be prevented. An adhesive may be also applied to the connection terminals 61 and 71.

As described above, embodiment 1 of the invention provides a printed wiring board of a simple structure at a low cost for upright setting of a card board. It is also readily adaptable to change in the number of patterned external connection terminals (pins) of a card board, which are in contact therewith.

Now, another designs of a card board guide provided in a printed wiring board of the invention is described by referring to FIGS. 13 to 16.

Figure 13:
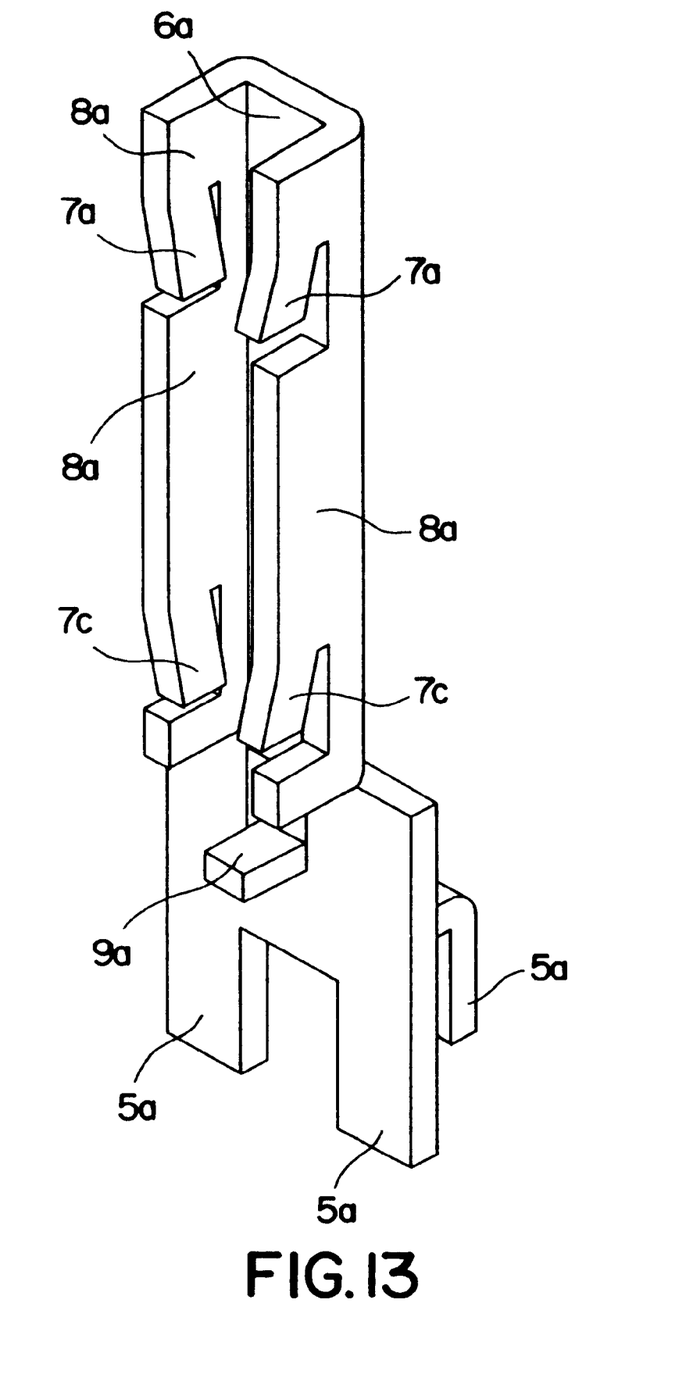
FIG. 13 is an outside perspective view of a board guide different from that shown in FIG. 1 according to embodiment 1 of the invention.

As shown in FIG. 13, a card board guide 6a attached to a printed wiring board comprises tongue elements (contact elements) 7a and 7c, board guide portion 8a, stopper 9a and three lead legs 5a. The guide 6a is formed in a U-shape at an end surface in the inserting direction of a card board, and is provided in either side of the confronting guide portions 8a with the tongue elements 7a and 7c, respectively, that are elastically deformed in shape for clamping the card board.

Figure 15:
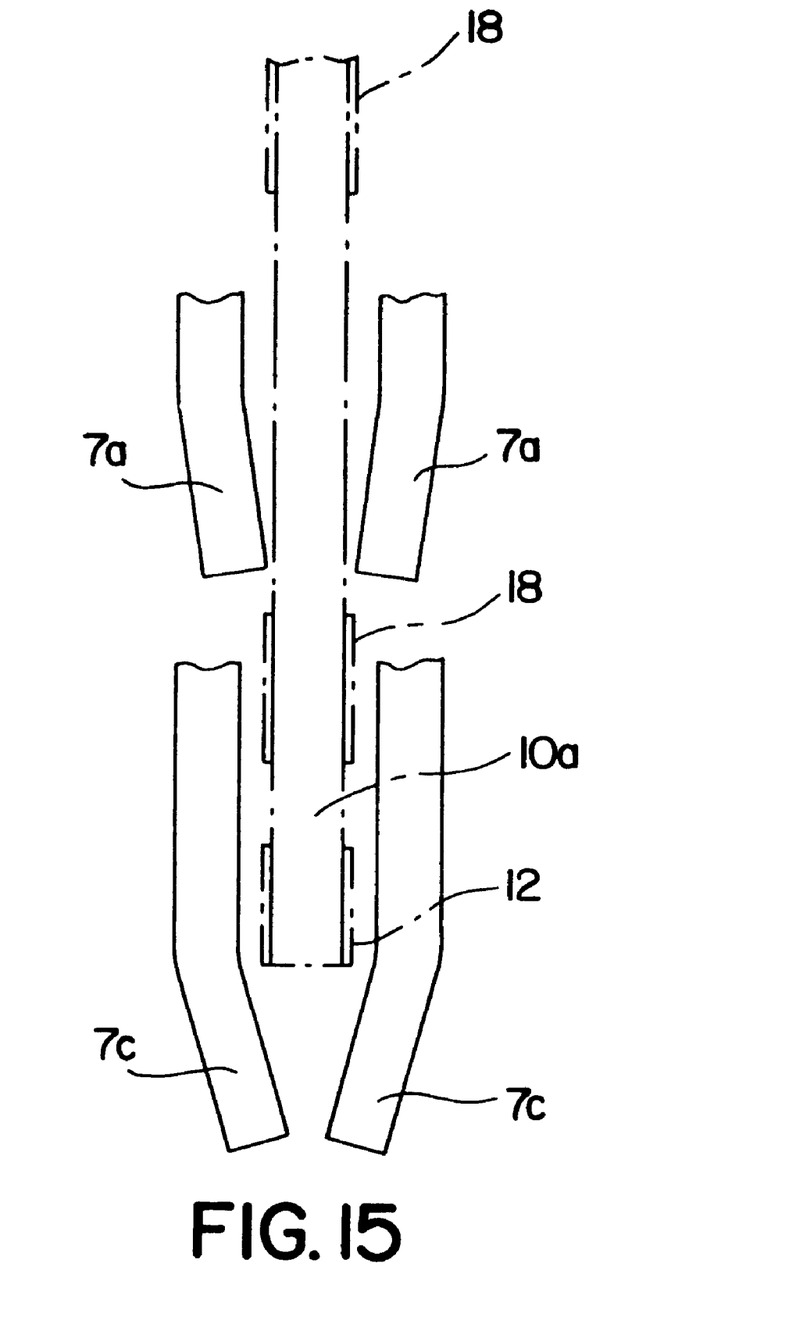
FIG. 15 is a front view showing a process of inserting a card board to a printed wiring board with the board guide of FIG. 13 attached thereto.
Figure 16:
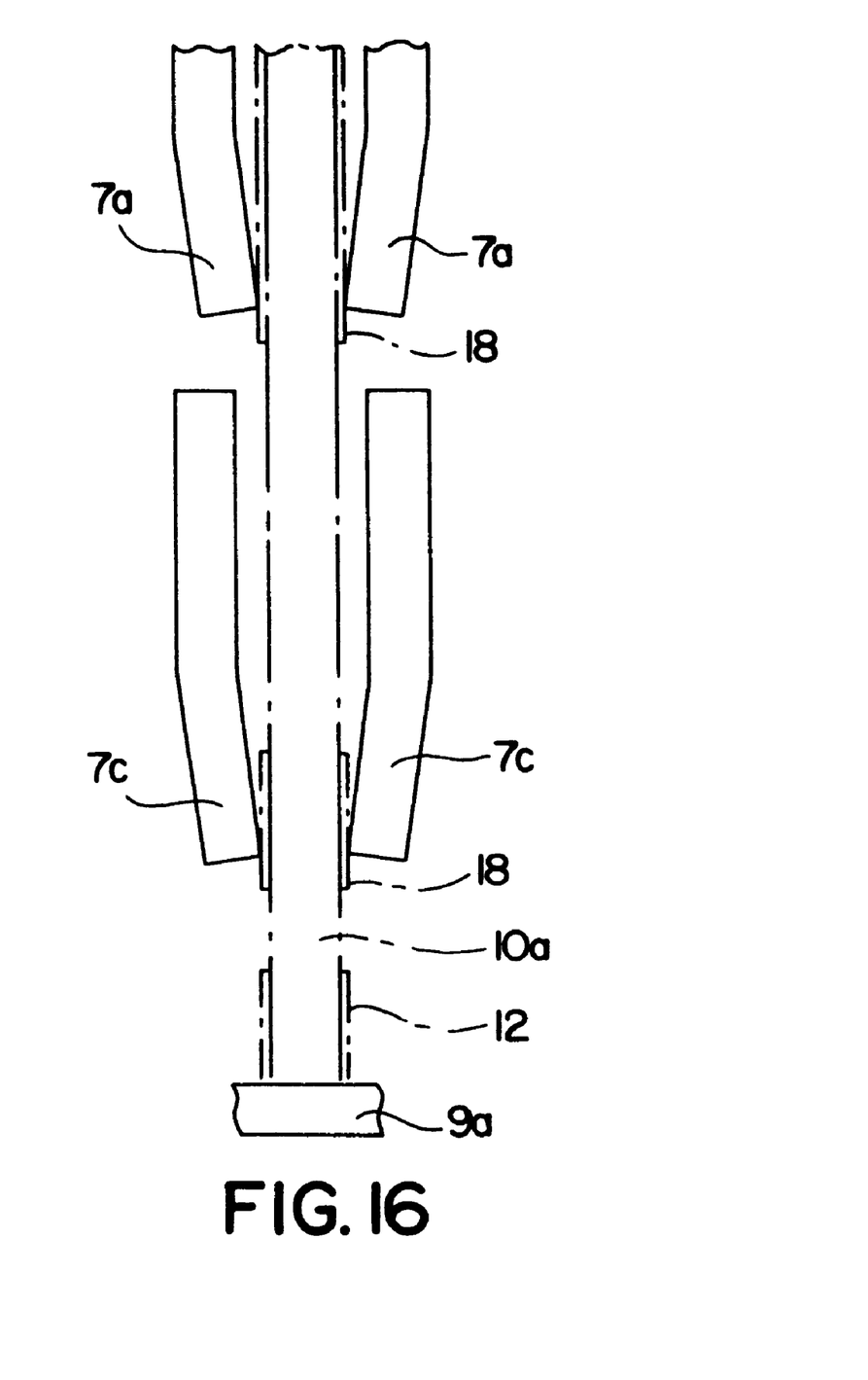
FIG. 16 is a front view after insertion of the card board.

As shown in FIG. 15, the card board 10a is inserted as it is restrictively guided by the guide portion 8a, and brought into contact with the upper tongue element 7a. As the card board 10a is further inserted, the tongue element 7a is spread, and the lower tongue element 7c is also spread. The card board 10a is further inserted, and the insertion of the card board is stopped as it abuts against the stopper 9a. In such state, the tongue elements 7a and 7c are in contact with a circuit pattern 18 of the card board 10a, for example, a grounding pattern.

The card board guide 6a is formed by press working of a metal plate or resin molding. In such constitution, unsteadiness of the card board can be prevented. When the card board guide is formed of such conductive material as a metal, the card board can be efficiently grounded to the main board, and unwanted radiation can be reduced. Such metal plate as elastic phosphor bronze plate and spring steel plate may be arbitrarily employed.

Figure 14:
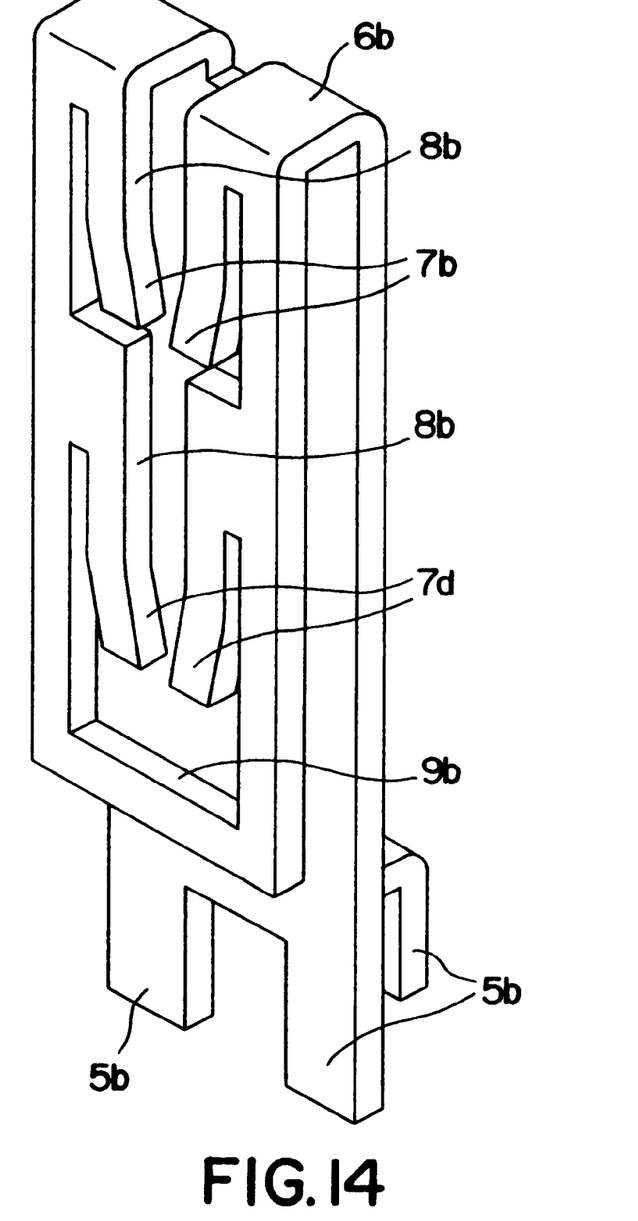
FIG. 14 is an outside perspective view of another board guide.

The other card board guide (3b shown in FIG. 14 for use with a printed wiring board comprises tongue elements 7b and 7d, a card guide portion 8b, a stopper 9b and three lead legs 5b. The guide 6b is formed in the shape of a hook in a side surface in the inserting direction of a card board, and is provided in a central portion of the main bent surface with the tongue elements (contact elements) 7b and 7d that are elastically deformed in shape for clamping the card board. In this case, the card board guide 6b is also formed by press working of a metal plate or resin molding. The guide of such structure provides operations and functional effects similar to those of that in FIG. 13.

(Embodiment 2)

Figure 17:
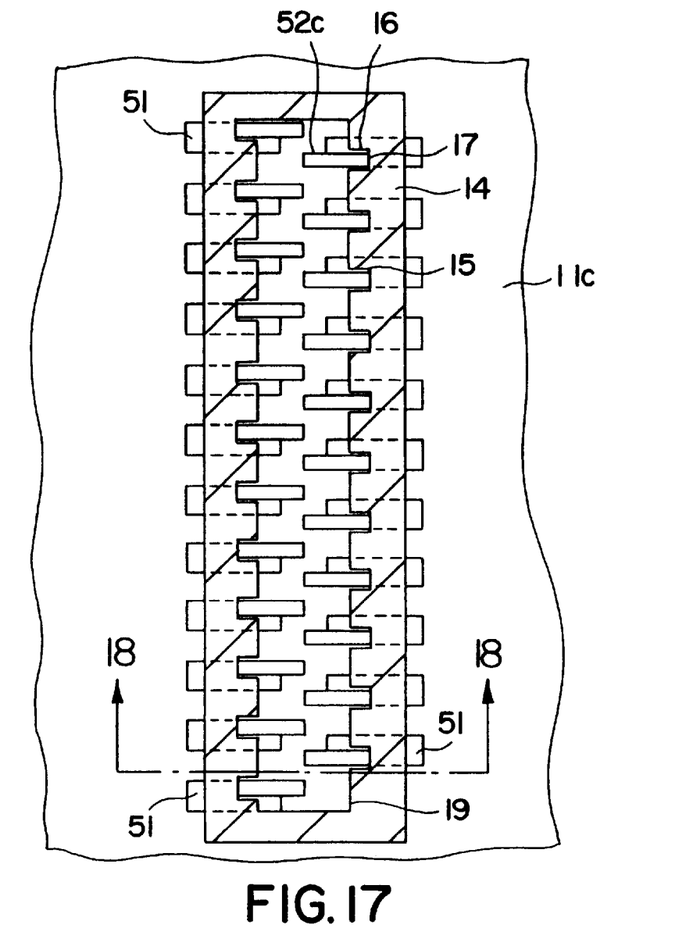
FIG. 17 is a perspective view showing a main part, of a printed wiring board according to embodiment 2 of the invention.
Figure 18:
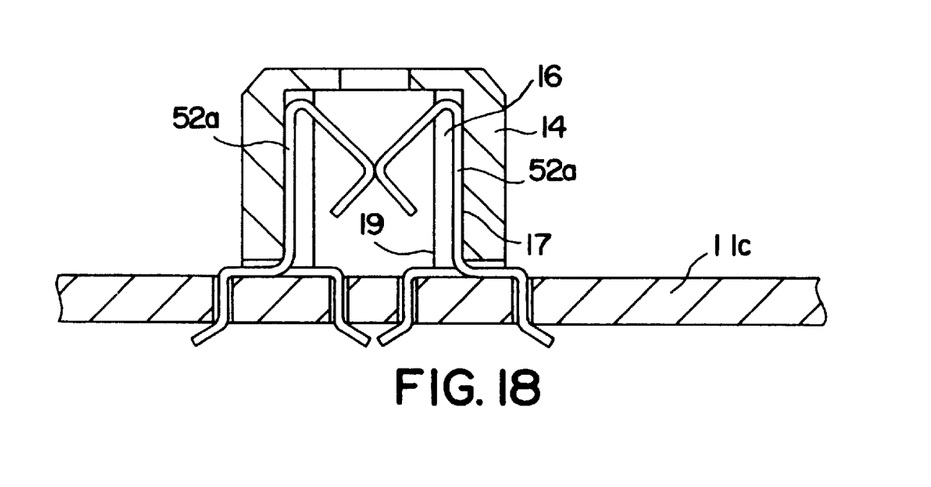
FIG. 18 is a sectional view taken along a line B—B in FIG. 17.

By referring to FIGS. 17 to 18, a printed wiring board according to embodiment 2 of the invention is described.

A printed wiring board according to embodiment 2 is constructed by inserting connection terminals 51 to a main board 11c so that two rows of connection terminals 51 are formed, then surrounding the rows by a frame 14. Such construction is effective for preventing inclination and displacement of the connection terminals 51 inserted to the main board 11c, and establishing reliable contact with a card board.

As shown in FIGS. 17 and 18, the rectangular frame 14 is provided with a slit 19 for inserting a card board and grooves 15 for holding respective connection terminals 51, and restricting their position. As the connection terminal 51 is held in the groove 15, a side 52c of the connection terminal 51 is restricted in position by a side surface 16 of the groove 15, so that contact with the adjacent connection terminal can be prevented. A back side 52a of the connection terminal 51 is also supported by a rear side 17 of the groove 15, and a backward movement is prevented. As a result, when a card board is inserted, the connection terminals can be reliably brought into contact with an end of a circuit pattern.

Thus, in a printed wiring board of embodiment 2, mutual contact and backward deflection, when a card board is inserted, of connection terminals vertically set can be prevented by provision of the frame. It means that electrical connection between a circuit pattern of a card board and the connection terminals can be reliably established.

As described above, according to a printed wiring board of the invention, upright setting of a card board can be achieved in a simple structure at a low cost. Further, it is readily adaptable to change in the number of patterned external connection terminals (pins) of a card board, which are in contact therewith. Further, a card board can be efficiently grounded to a main board, and unwanted radiation can be reduced.

What is claimed is:

1. A printed wiring board for holding a card board comprising:
    a main board having a top surface and including a circuit pattern; and
    pair of rows of connection terminals confronting each other and adapted for holding the card board between said rows, so that said card board is contacting said top surface of said main board,
    each connection terminal being formed of a bendable member, the bendable member having a closed loop disposed above the top surface of said main board, electrically connected with the circuit pattern, providing a respective horizontal force directed to a region between said rows, and said closed loop terminating in a pair of ends extending through the main board, spaced apart along a direction of said horizontal force, and spaced apart from each other at the main board,
    wherein an aggregate horizontal force provided by the pair of rows of connection terminals by themselves, is sufficient to hold the card board into place.

2. A printed wiring board of claim 1, wherein each connection terminal has a C-shape configuration at a side in contact with the card board.

3. A printed wiring board of claim 2, wherein a first one of the pair of rows of connection terminals is offset from a second one of the pair of rows of connection terminals in an opposed arrangement.

4. A printed wiring board of claim 1, wherein each connection terminal is coupled to the main board at a predetermined interval.

5. A printed wiring board of claim 1, wherein the pair of rows of connection terminals holds the card board substantially perpendicular to the main board.

6. A printed wiring board for holding a card board comprising:

a main board having a top surface and including a circuit pattern; and a pair of rows of connection terminals confronting each other and adapted for holding the card board between said rows so that said card board is contacting said top surface of said main board, each connection terminal being formed of a bendable member, the bendable member having a closed loop disposed above the top surface of said main board, electrically connected with the circuit pattern, providing a respective horizontal force directed to a region between said rows, and said closed loop terminating in a pair of ends extending through the main board, spaced apart along a direction of said horizontal force, and spaced apart from each other at the main board; and a pair of guides provided at each end of the pair of rows for maintaining the card board substantially perpendicular to the main board, wherein an aggregate horizontal force provided by the pair of rows of connection terminals by themselves, is sufficient to hold the card board into place.

7. A printed wiring board of claim 6, wherein each connection terminal has a C-shape configuration at a side in contact with the card board.

8. A printed wiring board of claim 7, wherein each guide has a U-shape cross-section.

9. A printed wiring board of claim 8, wherein each guide comprises a resin member.

10. A printed wiring board of claim 6, wherein the card board has a circuit pattern, and the pair of guides contacts the circuit pattern of the card board.

11. A printed wiring board of claim 6, wherein each connection terminal is coupled to the main board at a predetermined interval.

12. A printed wiring board of claim 6, wherein the pair of rows of connection terminals holds the card board substantially perpendicular to the main board.

13. A printed wiring board for holding a card board comprising:

a main board having a top surface and including a circuit pattern; and a pair of rows of connection terminals confronting each other and adapted for holding the card board between said rows so that said card board is contacting said top surface of said main board, each connection terminal being formed of a bendable member, the bendable member having a closed loop disposed above the top surface of said main board, electrically connected with the circuit pattern, providing a respective horizontal force directed to a region between said rows, and said closed loop terminating in a pair of ends extending through the main board, spaced apart along a direction of said horizontal force, and spaced apart from each other at the main board; and a pair of guides provided at respective ends of the pair of rows, each guide including a clamping portion for clamping the guide to the card board, wherein an aggregate horizontal force provided by the pair of rows of connection terminals by themselves, is sufficient to hold the card board into place.

14. A printed wiring board of claim 13, wherein the card board has a circuit pattern and the pair of guides contacts the circuit pattern of the card board.

15. A printed wiring board of claim 13, wherein the card board has a circuit pattern, and the circuit pattern of the card board is clamped by the clamping portion of the pair of guides and contacts the pair of guides.

16. A printed wiring board of claim 15, wherein each guide comprises a conductive member.

17. A printed wiring board of claim 16, wherein the conductive member is metallic.

18. A printed wiring board of claim 17, wherein the circuit pattern of the card board comprises a grounding pattern.

19. A printed wiring board of claim 13, wherein each connection terminal is coupled to the main board at a predetermined interval.

20. A printed wiring board of claim 11, wherein the pair of rows of connection terminals holds the card board substantially perpendicular to the main board.

21. A printed wiring board for holding a card board comprising:

a main board having a top surface and including a circuit pattern; and a pair of rows of connection terminals confronting each other and adapted for holding the card board between said rows so that said card board is contacting said top surface of said main board, each connection terminal being formed of a bendable member, the bendable member having a closed loop disposed above the top surface of said main board, electrically connected with the circuit pattern, providing a respective horizontal force directed to a region between said rows, and said closed loop terminating in a pair of ends extending through the main board, spaced apart along a direction of said horizontal force, and spaced apart from each other at the main board; and a guide including an elastic tongue for clamping the card board, wherein the guide has a U-shape cross-section at an end surface of the guide, wherein an aggregate horizontal force provided by the pair of rows of connection terminals by themselves, is sufficient to hold the card board into place.

22. A printed wiring board of claim 21, wherein the card board has a circuit pattern and the circuit pattern of the card board is in contact with the elastic tongue of the guide.

23. A printed wiring board of claim 21, wherein each connection terminal is coupled to the main board at a predetermined interval.

24. A printed wiring board of claim 21, wherein the pair of rows of connection terminals holds the card board substantially perpendicular to the main board.

25. A printed wiring board for holding a card board comprising:

a main board having a top surface and including a circuit pattern; and a pair of rows of connection terminals confronting each other and adapted for holding the card board between said rows so that said card board is contacting said top surface of said main board, each connection terminal being formed of a bendable member, the bendable member having a closed loop disposed above the top surface of said main board, electrically connected with the circuit pattern, providing a respective horizontal force directed to a region between said rows, and said closed loop terminating in a pair of ends extending through the main board, spaced apart along a direction of said horizontal force, and spaced apart from each other at the main board; and a guide including an elastic tongue for clamping the card board at a center portion of the guide, wherein the guide is formed in a hook-shape at a side surface of the guides, wherein an aggregate horizontal force provided by the pair of rows of connection terminals by themselves, is sufficient to hold the card board into place.

26. A printed wiring board of claim 25, wherein the card board has a circuit pattern and the circuit pattern of the card board is in contact with the elastic tongue of the guide.

27. A printed wiring board of claim 25, wherein each connection terminal is coupled to the main board at a predetermined interval.

28. A printed wiring board of claim 25, wherein the pair of rows of connection terminals holds the card board substantially perpendicular to the main board.

29. A printed wiring board for holding a card board comprising:

a main board having a top surface and including a circuit pattern; and a pair of rows of connection terminals confronting each other and adapted for holding the card board between said rows so that said card board is contacting said top surface of said main board, each connection terminal being formed of a bendable member, the bendable member having a closed loop disposed above the top surface of said main board, electrically connected with the circuit pattern, providing a respective horizontal force directed to a region between said rows, and said closed loop terminating in a pair of ends extending through the main board, spaced apart along a direction of said horizonital force, and spaced apart from each other at the main board; and a frame surrounding the pair of rows of connection terminals, wherein an aggregate horizontal force provided by the pair of rows of connection terminals by themselves, is sufficient to hold the card board into place.

30. A printed wiring board of claim 29, wherein the frame comprises a slit for inserting the card board and grooves for limiting spacing between the connection terminals.

31. A printed wiring board of claim 29, wherein each connection terminal is coupled to the main board at a predetermined interval.

32. A printed wiring board of claim 29, wherein the pair of rows of connection terminals holds the card board substantially perpendicular to the main board.

\* \* \* \* \*

UNITED STATES PATENT AND TRADEMARK OFFICE
CERTIFICATE OF CORRECTION

PATENT NO. : 6,017,246
DATED : January 25, 2000
INVENTOR(S) : Hisazumi et al.

Page 1 of 1

It is certified that error appears in the above-identified patent and that said Letters Patent is hereby corrected as shown below:

<u>Column 6,</u>
Line 37, before "pair" insert --a--.

<u>Column 8,</u>
Line 10, delete "11" and insert --13--.
Line 64, delete "guides" and insert --guide--.

Signed and Sealed this

Nineteenth Day of June, 2001

Attest:

NICHOLAS P. GODICI
Attesting Officer *Acting Director of the United States Patent and Trademark Office*